(12) United States Patent
Okazaki et al.

(10) Patent No.: US 6,818,321 B2
(45) Date of Patent: Nov. 16, 2004

(54) HIGH-TEMPERATURE STRENGTH MEMBER

(75) Inventors: Masakazu Okazaki, Tokyo (JP); Yoshio Harada, Hyogo (JP); Tatsuo Suidzu, Hyogo (JP)

(73) Assignee: Tocalo Co., Ltd., Hyogo (JP)

( * ) Notice: Subject to any disclaimer, the term of this patent is extended or adjusted under 35 U.S.C. 154(b) by 0 days.

(21) Appl. No.: 10/279,917

(22) Filed: Oct. 25, 2002

(65) Prior Publication Data

US 2003/0170505 A1 Sep. 11, 2003

(30) Foreign Application Priority Data

Nov. 2, 2001 (JP) ........................................ 2001-338256

(51) Int. Cl.$^7$ ............................. B32B 15/04; F03B 3/12
(52) U.S. Cl. ........................ 428/632; 428/650; 428/678; 428/679; 428/680; 428/655; 428/687; 428/660; 416/241 R
(58) Field of Search ........................... 420/449; 428/621, 428/632, 633, 652, 655, 678, 680, 650, 679, 469, 701, 702, 697, 699, 687, 660; 416/241 R

(56) References Cited

U.S. PATENT DOCUMENTS

| | | |
|---|---|---|
| 3,873,347 A | 3/1975 | Walker et al. |
| 3,918,139 A | 11/1975 | Felten |
| 3,928,026 A | 12/1975 | Iecht et al. |
| 3,976,436 A | 8/1976 | Chang |
| 4,005,589 A | 2/1977 | Uhlir |
| 4,029,477 A | 6/1977 | Grisik |
| 4,080,204 A | 3/1978 | Panzera |
| 4,095,003 A | 6/1978 | Weatherly et al. |
| 4,101,713 A | 7/1978 | Hirsch et al. |
| 4,101,715 A | 7/1978 | Rairden, III |
| 4,124,737 A | 11/1978 | Wolfla et al. |
| 4,198,442 A | 4/1980 | Gupta et al. |
| 4,248,940 A | 2/1981 | Goward et al. |
| 4,275,124 A | 6/1981 | McComas et al. |
| 4,312,682 A | 1/1982 | Herchenroeder |
| 4,313,760 A | 2/1982 | Dardi et al. |
| 4,339,509 A | 7/1982 | Dardi et al. |
| 4,419,416 A | 12/1983 | Gupta et al. |
| 4,447,503 A | 5/1984 | Dardi et al. |
| 4,451,431 A | 5/1984 | Naik |
| 4,615,865 A | 10/1986 | Duvall et al. |
| 5,043,138 A | 8/1991 | Darolia et al. |
| 5,154,884 A | 10/1992 | Wukusick et al. |
| 5,240,491 A | 8/1993 | Budinger et al. |
| 5,399,313 A | 3/1995 | Ross et al. |
| 6,210,812 B1 * | 4/2001 | Hasz et al. |
| 6,355,356 B1 | 3/2002 | Hasz |
| 6,451,454 B1 * | 9/2002 | Hasz et al. |
| 6,468,669 B1 * | 10/2002 | Hasz et al. |
| 2001/0019781 A1 | 9/2001 | Hasz |

FOREIGN PATENT DOCUMENTS

EP        1103628        5/2001

(List continued on next page.)

OTHER PUBLICATIONS

English Language Abstract for JP Appln. No. 59–006352.

(List continued on next page.)

Primary Examiner—Jennifer McNeil
(74) Attorney, Agent, or Firm—Greenblum & Bernstein, P.L.C.

(57) ABSTRACT

A high-temperature strength member comprises a substrate of Ni-based single crystal alloy or a Ni-based unidirectional solidified alloy and a coating of a B-containing alloy having a specified B content formed on the surface thereof by a spraying process or a vapor deposition process.

20 Claims, 5 Drawing Sheets

FOREIGN PATENT DOCUMENTS

| | | |
|---|---|---|
| JP | 5110131 | 7/1974 |
| JP | 50-29436 | 3/1975 |
| JP | 52-3522 | 6/1975 |
| JP | 51-33717 | 6/1975 |
| JP | 50158531 | 12/1975 |
| JP | 51-30530 | 3/1976 |
| JP | 5194413 | 8/1976 |
| JP | 5233842 | 3/1977 |
| JP | 52-66836 | 6/1977 |
| JP | 5288226 | 7/1977 |
| JP | 52117826 | 10/1977 |
| JP | 5333931 | 3/1978 |
| JP | 5385829 | 7/1978 |
| JP | 53112234 | 9/1978 |
| JP | 5416325 | 2/1979 |
| JP | 5465718 | 5/1979 |
| JP | 5466342 | 5/1979 |
| JP | 55113871 | 9/1980 |
| JP | 55115941 | 9/1980 |
| JP | 55161041 | 12/1980 |
| JP | 56119766 | 1/1981 |
| JP | 56-62956 | 5/1981 |
| JP | 5693847 | 7/1981 |
| JP | 56108850 | 8/1981 |
| JP | 57155338 | 9/1982 |
| JP | 57177952 | 11/1982 |
| JP | 57185955 | 11/1982 |
| JP | 5837145 | 3/1983 |
| JP | 5837146 | 3/1983 |
| JP | 58141355 | 8/1983 |
| JP | 59118847 | 12/1983 |
| JP | 59001654 | 1/1984 |
| JP | 59006352 | 1/1984 |
| JP | 59-89745 | 5/1984 |
| JP | 60141842 | 7/1985 |
| JP | 08311632 | 11/1996 |
| JP | 083211633 | 11/1996 |

OTHER PUBLICATIONS

English Language Abstract for JP Appln. No. 51–10131.
English Language Abstract for JP Appln. No. 55–115941.
English Language Abstract for JP Appln. No. 58–141355.
English Language Abstract for JP Appln. No. 57–155338.
English Language Abstract for JP Appln. No. 52–3522.
English Language Abstract for JP Appln. No. 59–118847.
English Language Abstract for JP Appln. No. 51–33717.
English Lanaguage Abstract for JP Appln. No. 56–119766.
English Language Abstract for JP Appln. No. 55–113871.
English Language Abstract for JP Appln. No. 59–001654.
English Language Abstract for JP Appln. No. 08–311632.
English Language Abstract for JP Appln. No. 08–311633.

* cited by examiner

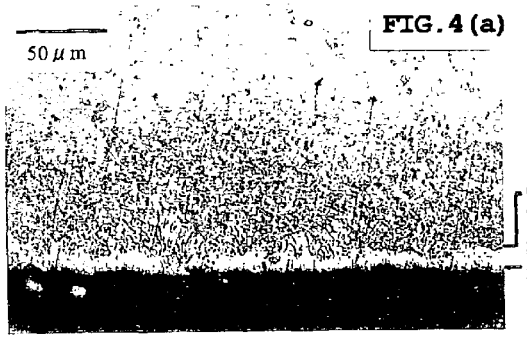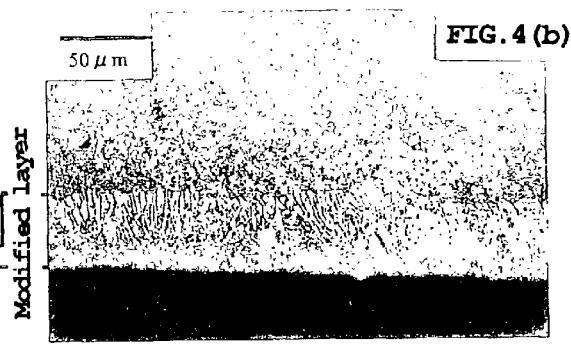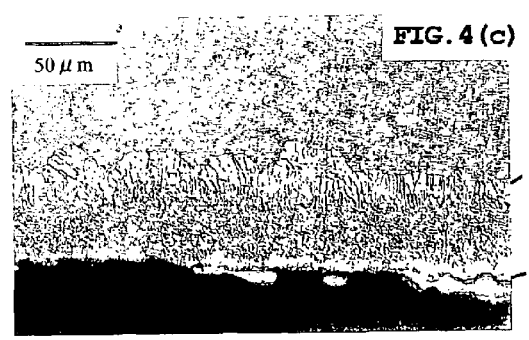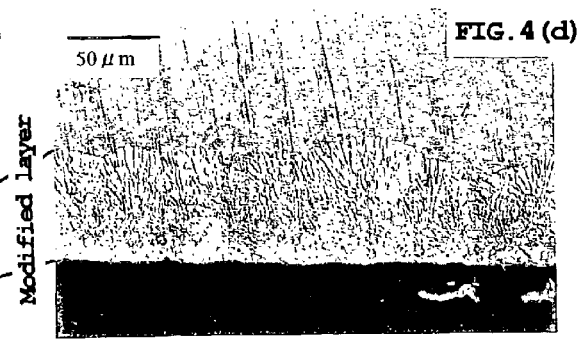

FIG.5(a)
FIG.5(b)
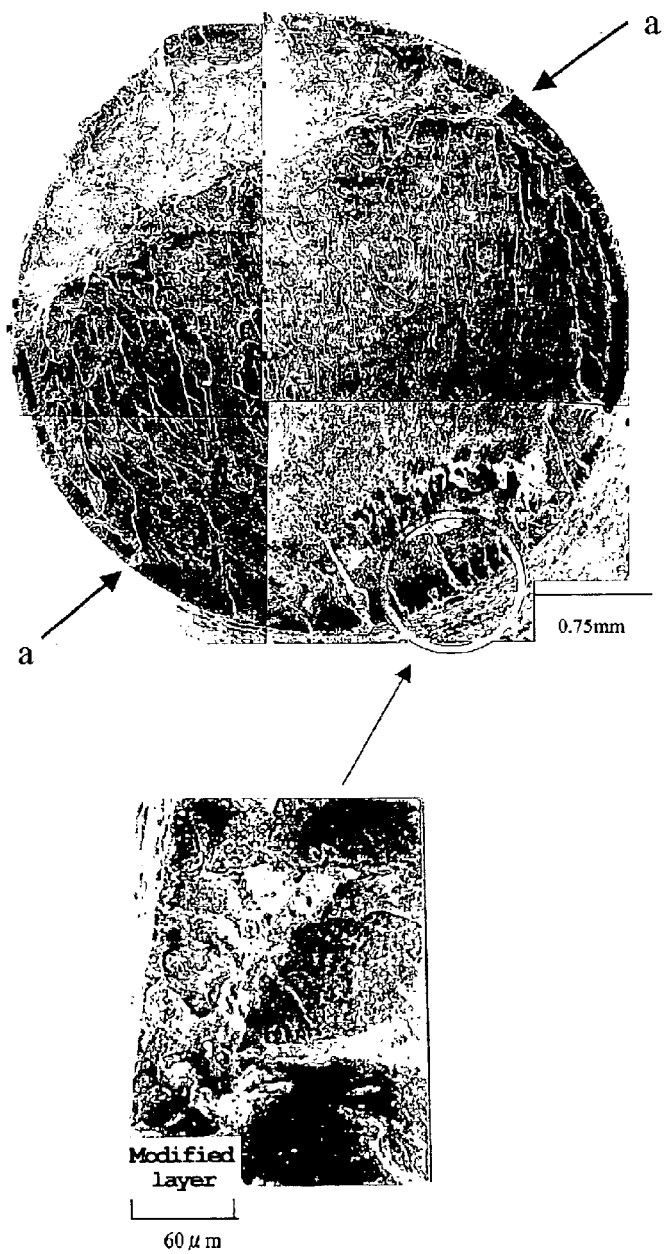
a-a sectional view

HIGH-TEMPERATURE STRENGTH MEMBER

BACKGROUND OF THE INVENTION

1. Field of the Invention

This invention relates to a high-temperature strength member used in a high-temperature exposed portion of a gas turbine, a jet engine or the like, and more particularly to a high-temperature strength member constructed by forming a film for preventing the lowering of high-temperature strength due to plastic work strain on a surface of a dynamic-static blade substrate made of Ni-based single crystal alloy or Ni-based unidirectional solidified alloy.

2. Description of Related Art

Recently, studies on the gas turbine are made for raising a working gas temperature in order to improve a heat efficiency, and hence a temperature of an inlet port in the turbine becomes higher than 1500° C. at the present time, and it is demanded to develop a further temperature raising technique.

Such a temperature raising technique of the gas turbine is largely dependent upon the advance of a material for a turbine blade member directly exposed to a high-temperature combustion gas (including development of coatings for resistance to high-temperature oxidation and heat shielding) and the development of a technique of cooling the blade, and is also an important studying matter up to the present.

Particularly, the turbine blade is a central matter on the study of the blade member because it is subjected to creep through centrifugal force under an operating environment, thermal fatigue through start and stop of the turbine, high cycle fatigue through mechanical vibrations, and further corrosion action through impurities included in combustion gas such as sea salt particles, sulfur, vanadium and the like.

The outline of the state studying and developing the conventional turbine blade member is summarized as follows.

(1) Strengthening of alloys through precipitation-dispersion of a great amount of an intermetallic compound [$Ni_3(Al, Ti)$] called as γ'-phase;

(2) Development of alloying process considering solid-solution strengthening of matrix phase γ and γ'-phase and atomic arrangement of crystal boundary bade on a delicate balance of compositions in both phases, and development of alloys utilizing the success;

(3) Establishment of production method of high quality alloys by removing influence of slight impurities, gas and the like through adoption of vacuum melting technique;

(4) Development of high performance blade member through conversion from cast shaping to precision casting technique (enlargement of freedom degree in the field of cooling mechanism);

(5) Production of columnar crystal blade member from equiaxed crystal through development of unidirectional solidifying process of alloy;

(6) Development of a single crystal blade member solving the deterioration of material strength resulted from crystal grain boundary of polycrystalline alloy;

(7) A chemical composition of the single crystal blade member comprises Ni: 55–70 mass % as a main component and further contains other elements of Cr: 2–15 mass %, Co: 3–13 mass %, Mo: 0.4–8 mass %, W: 4.5–8 mass %, Ta: 2–12 mass %, Re: 3–6 mass %, Al: 3.4–6 mass %, Ti: 0.2–4.7 mass %, Hf: 0.04–0.2 mass %, C: 0.06–0.15 mass %, B: 0.001–0.02 mass %, Zr: 0.01–0.1 mass %, Nb: 0.1–1.5 mass % and the like. In these alloys, Cr and Al contents effective for resistance to high-temperature oxidation are relatively small, so that an excellent high-temperature strength is first developed by applying a surface-treated coating having a resistance to high-temperature oxidation and resistance to high-temperature corrosion (hereinafter referred to as resistance to high-temperature environment).

(8) To a high-temperature exposed member such as a gas turbine, a jet engine or the like is further applied an alloy coating having an excellent resistance to high-temperature oxidation called as "MCrAlX alloy". In this case, M is Ni, Co or Fe alone, or an alloy consisting of these plural elements and X is an element of Y, Hf, Sc, Ce, La, Th, B or the like.

Even in such MCrAlX alloy, there are many proposals having various chemical compositions in accordance with use purposes. Prior techniques as to these alloys are mentioned as follows:

JP-A-58-37145, JP-A-58-37146, JP-A-59-6352, JP-A-59-89745, JP-A-50-29436, JP-A-51-30530, JP-A-50-158531, JP-A-51-10131, JP-A-52-33842, JP-A-55-115941, JP-A-53-112234, JP-A-52-66836, JP-A-52-88226, JP-A-53-33931, JP-A-58-141355, JP-A-56-108850, JP-A-54-16325, JP-A-57-155338, JP-A-52-3522, JP-A-54-66342, JP-A-59-118847, JP-A-56-62956, JP-A-51-33717, JP-A-54-65718, JP-A-56-93847, JP-A-51-94413, JP-A-56-119766, JP-A-55-161041, JP-A-55-113871, JP-A-53-85829, JP-A-57-185955, JP-A-52-117826, JP-A-60-141842, JP-A-57-177952, JP-A-59-1654.

These alloys have been mainly developed as a coating for polycrystalline alloy blade member having a resistance to high-temperature environment, but they are effective for a single crystal alloy or a unidirectional solidified alloy and are widely adopted.

On the other hand, Ni-based single crystal alloy and Ni-based unidirectional solidified alloy (hereinafter abbreviated as single crystal alloy, unidirectional solidified alloy simply) have a characteristic that when it is heated to a higher temperature at a state of subjecting to fatigue or thermal fatigue damage by plastic working or impact or further under an actual operating environment as a turbine blade, a portion of residual strain based on working or impact is modified to form a modified layer (see FIG. 4(a)–FIG. 4(d)). This modified layer portion is considered to be an aggregate of fine crystals, which can not be determined by the observation with an optical microscope, or a preparatory state thereof, but is confirmed by the inventors' experiment that it is very brittle and simply forms many small cracks under a slight stress as a start point of breakage (see FIG. 5(a)–FIG. 5(b)).

Heretofore, there has been studied no technique that the decrease of the high-temperature strength resulted from the modified layer appearing on the surface of the substrate is prevented by surface coating. It is well-known that the aforementioned MCrAlX alloy coating is only applied to the improvement of the resistance to high-temperature environment targeting corrosion damage resulted from the high-temperature combustion gas.

SUMMARY OF THE INVENTION

The invention is to solve the following subject matters inherent to the blade member made of the single crystal alloy or unidirectional solidified alloy by the formation of sprayed coating or vapor deposition coating.

(i) The blade member of the single crystal alloy or unidirectional solidified alloy has a characteristic that when it is subjected to slight machining strain, roughening through blast treatment and the like at the production step, in the operation as the turbine blade, at the formation step of the protection coating and the like and then heated to a higher temperature, many fine crystal are produced on an affected portion to form a modified layer. This modified layer is brittle and produces many fine cracks under an application of small stress, which considerably deteriorate the high-temperature strength.

(ii) When only the conventional MCrAlX alloy sprayed coating is formed on the surface of the blade member made of the single crystal alloy or unidirectional solidified alloy at a state of subjecting to strain or machining, there can not be prevented the deterioration of the high-temperature strength accompanied with the formation of the above modified layer.

(iii) As a result, even in the dynamic and static blade members made of the single crystal alloy or unidirectional solidified alloy having an excellent high-temperature strength in a material technology, there is a state that the significance can not be sufficiently developed in the present technique.

The invention is to prevent the above problem inherent to the single crystal alloy or unidirectional solidified alloy as a high-temperature strength member, i.e. the deterioration of the high-temperature strength resulted from the breakage of crystal control (recrystallization in a broad meaning) induced by plastic working through a surface coating, and is developed based on the following technical ideas:

(a) When a coating of B-containing alloy containing B: 0.1–5 mass % is formed on a surface of a single crystal alloy or a unidirectional solidified alloy, as the alloy is heated, B diffuses and penetrates from the coating into an alloy substrate to enhance an interbonding force at recrystallized grain boundary, whereby the deterioration of the high-temperature strength in the alloy is prevented;

(b) After an undercoat comprised of the above B-containing alloy coating is formed on the surface of the single crystal alloy or unidirectional solidified alloy, an overcoat made of an alloy obtained by adding at least one element selected from Y, Hf, Ta, Cs, Ce, La, Th, W, Si, Pt and Mn to an alloy containing at least two of Co, Ni, Cr and Al (hereinafter referred at as MCrAlX alloy simply) is laminated on the undercoat, whereby the deterioration of the high-temperature strength resulted from the recrystallization phenomenon of the alloy is prevented and the resistance to high-temperature environment is improved with the MCrAlX alloy coating (overcoat);

(c) The surface of the overcoat made of the MCrAlX alloy is subjected to Al diffusion penetration treatment by CVD process or powder process to further improve the resistance to high-temperature environment in the overcoat;

(d) On the undercoat formed on the surface of the substrate is formed the overcoat made of the MCrAlX alloy, and a topcoat made of $ZrO_2$ based ceramic containing at least one oxide selected from $Y_2O_3$, CaO, MgO, $CeO_2$, $Yb_2O_3$, $Sc_2O_3$ and the like, whereby the high-temperature strength of the substrate is maintained and further the resistance to high-temperature environment is provided;

(e) On the surface of the substrate is formed a mixed coating of B-containing alloy and MCrAlX alloy, whereby the deterioration of the high-temperature strength due to the recrystallization of the single crystal alloy or the unidirectional solidified alloy is prevented and the resistance to high-temperature environment is improved.

In the invention, as the B-containing alloy formed on the surface of the substrate as an undercoat, it is preferable to use ones comprising 0.1–5.0 mass % of B and the remainder being two or more elements selected from Cr, Ni, Go, Mo, Al, Ta, W, Re, Zr, Hf, Y, Si, Pt, Fe and Ce and further being added with 0.01–1.5 mass % of C.

In the invention, the formation of the B-containing alloy coating (undercoat) formed on the surface of the substrate is carried out by a spraying process or a vapor deposition process, wherein it is preferable that a thickness of the coating is 2–150 μm and a content of oxygen in the coating is less than 1.5 mass % and the B-containing alloy is formed on the substrate surface at a closed state.

BRIEF DESCRIPTION OF THE DRAWINGS

The invention will be described with reference to accompanying drawings, wherein:

FIG. 4(a)–FIG. 4(d) are metallurgical micrographs of a modified layer forming on a plastic working portion.

FIG. 5(a)–FIG. 5(b) are metallurgical micrographs of a breaking surface of a fatigue test portion and a modified layer as a start point of breakage.

DETAILED DESCRIPTION OF THE INVENTION

Figure 1:
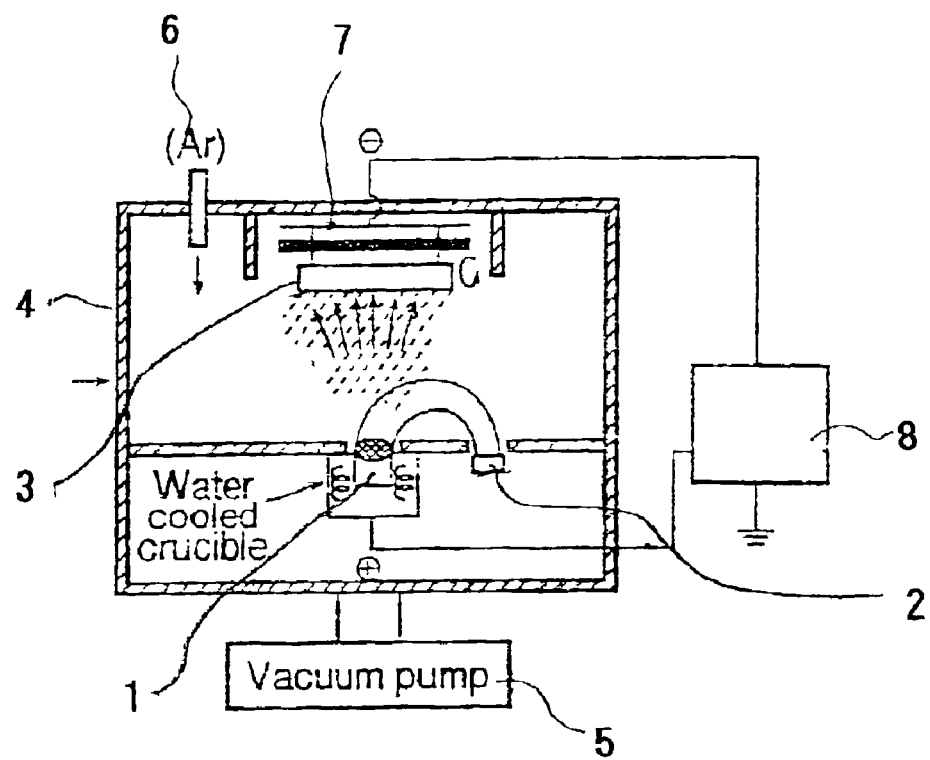
FIG. 1 is a schematic view of a PVD device using an electron beam as a heat source.

The metallurgical characteristics of the blade member made of the single crystal alloy or the blade member made of the unidirectional solidified alloy are made clear and the function mechanism of the protection coating according to the invention applied as the countermeasure is explained.

(1) Metallurgical Characteristic of the Ni-Based Single Crystal Alloy and Its Practical Problem The Ni-based single crystal alloy is developed for solving the problems inherent to many Ni-based polycrystal alloys usually used from the old time. In the polycrystal alloys, not only impurity elements but also various carbides and intermetallic compounds are apt to be easily concentrated or precipitated in crystal grain boundary under practical environment conditions of the gas turbine and further grow to decrease the bonding force of the grain boundary, which render into a start point of mechanical breakage.

In such a crystal grain boundary, the invasion of sulfur, vanadium and chloride included in the combustion gas and further oxidative substance such as steam or the like becomes easy, which is also a cause frequently inducing grain boundary corrosion injury.

In order to solve the problems resulted from such a crystal grain boundary, there has hitherto been developed an alloy added with a grain boundary strengthening element (e.g. C, B, Hf or the like) thereinto. However, this alloy is liable to easily form eutectic γ' having a low melting point, so that a solution treating temperature must be necessarily made low, which is not favorable in view of the improvement of the high-temperature strength of the alloy.

The Ni-based single crystal alloy has been developed for solving the metallurgical problems of the polycrystal alloys as mentioned above. In the single crystal alloy, therefore, the crystal grain boundary causing the breakage is not formed and the precipitation of the eutectic γ'-phase is not feared, so that it is a merit to enable the high-temperature solution treatment of the alloy. Also, the rendering of the solution temperature into a higher temperature equally precipitates and diffuses fine γ'-phase, whereby the high-temperature strength of the alloy can be improved.

However, it is elicited that the Ni-based single crystal alloy has a new problem which has never been recognized in the polycrystal alloy. It is elucidated that after strain of about several % (2–8%) is previously applied to the single crystal alloy or a mechanical plastic working is applied thereto, when the alloy is subjected to a heat treatment or exposed to an operating environment of the gas turbine, a worked portion and a heat-affected portion thereof appear as a modified layer and many fine crystals are formed therein (this phenomenon is called as "recrystallization phenomenon" hereinafter, see FIG. 4(a)–FIG. 4(d)). Such a recrystallized portion is very brittle and low in the high-temperature strength, so that there is floated a defect that many cracks are created around the crystal grain boundary by applying slight stress to considerably deteriorate the strength of the single crystal alloy as a whole (see FIG. 5(a)–FIG. 5(b)).

The formation of such a recrystal is not observed in the plastic working but is first generated by heating the single crystal alloy later, so that it is very difficult to conduct a prevention measure before it happens. Also, the temperature at which the recrystal appears is relatively low, so that the recrystal is detected even by subjecting to a heat treatment such as following solution treatment and aging treatment after the MCrAlX alloy sprayed coating usually used for improving the resistance to high-temperature environment is applied to dynamic and static blades made of a usual polycrystal alloy.

1273K–1573K 1–10 h (solution treatment)
973K–1273K 1–30 h (aging treatment)

Therefore, it is impossible to prevent the considerable deterioration of the high-temperature strength accompanied with the recrystallization phenomenon of the substrate only by the application of the MCrAlX alloy coating aiming at the resistance to high-temperature environment. Furthermore, the means for adding the element to the substrate itself is critical owing to the aforementioned reasons.

It is thought that the risk of stress application or plastic working to the Ni-based single crystal alloy is caused at production process of dynamic-static blades, working process of protection coating, removing and retreating process of the protection coating on the surface of the blade during the operation of the gas turbine and after the use. Therefore, it is difficult to anticipate the presence or absence of the occurrence of the recrystallization phenomenon, and the excellent high-temperature strength of the single crystal alloy can not be effectively utilized in a high reliability. For example, as an environmental condition bringing the risk of applying stress or plastic deformation working to the blade member of the single crystal alloy, there are considered the production and running steps of the blade member, assembling step of gas turbine, blast roughening step as a preliminary treatment for spraying, impact process of spraying particles, transportation and inspection steps in the spraying process, impact of fine solid particles including in combustion gas during the operation of the gas turbine, blast treatment or polishing step in recoating of the protection coating applied onto the blade surface of the single crystal alloy and so on.

Similarly, the recrystallization phenomenon appearing in the above single crystal alloy and influences thereof are recognized in the unidirectional solidified alloy in greater or lesser degrees.

(2) Solution of Recrystallization Problem in Ni-Based Single Crystal Alloy Through the Application of the Protection Coating According to the Invention As the protection coating for a high-temperature member such as gas turbine, jet engine or the like, the above MCrAlX alloy is typical up to the present time. The coating of the MCrAlX alloy is formed by spraying process or vapor deposition process for protecting the member from corrosion action through high-temperature combustion gas. Therefore, the problems resulted from the recrystallized portion of the alloy substrate aiming at the invention are not solved. Moreover, the chemical composition of the known MCrAlX alloy can not attain the object of the invention.

The invention is different from the conventional MCrAlX alloy and is characterized in that B-containing alloy material having a chemical composition as mentioned in detail later is used and a given coating (undercoat) is formed on a substrate surface of a blade member of a single crystal alloy by a spraying process or a vapor deposition process.

That is, a coating of B-containing alloy comprising 0.1–5.0 mass % of B and the remainder being two or more elements selected from Cr, Ni, Co, Mo, Al, Ta, W, Re, Zr, Hf, Y, Si, Pt, Ti, Fe and Ce or further containing 0.01–1.5 mass % of C is formed on the substrate surface as an undercoat.

The components such as B, Zr, Hf, C and the like develop a remarkable effect of preventing the deterioration of the high-temperature strength due to the recrystallization phenomenon of the single crystal alloy even in a small addition amount. Especially, B diffuses and penetrates from the sprayed coating into the alloy portion as the single crystal alloy is heated to start the recrystallization and hence a bonding force at the recrystallized grain boundary is enhanced to develop a large effect of maintaining the high-temperature strength. Also, the other Zr, Hf and C can expect the same action as in B, and metals of Zr, Hf have an effect of improving a bonding force between grains in the protection coating heated to a high temperature.

The reason why the addition amount of B is limited to the range as defined above is due to the fact that when B is less than 0.1 mass %, the strengthening of the recrystallized grain boundary is insufficient, while when it exceeds 5 mass %, the softening point or melting point of the sprayed coating is dropped to lower the high-temperature strength as the coating. As B too largely diffuses into the single crystal alloy portion, the melting point of the alloy itself locally lowers.

The addition amount of each of Zr, Hf is preferably within a range of 0.01–1.8 mass %. When it is less than 0.01 mass %, the action of strengthening the grain boundary is weak, while when it exceeds 1.8 mass %, the effect is not exceptionally recognized.

The other adding elements as a main component constituting the undercoat withstand oxidation or corrosion action through combustion gas from exterior when the surface of the single crystal alloy is covered with these metal components and develop an action of mechanically protecting the alloy against a phenomenon such as impact of fine solid matter or the like. The action of B effective for the recrystallized portion is performed by the presence of high-temperature stable protection coating constituted with these metal elements, so that each of them plays an important role.

In the invention, contents of these metal elements are experimentally decided as follows.

Ni≦75 mass %, Co≦70 mass %, Cr: 5–30 mass %, Al: 1–18 mass %, Mo≦8 mass %, Ta: 1–5 mass %, W≦15 mass %, Re: 0.5–3.5 mass %. Also, each of Y, Si, Pt, Ti, Fe, Ce is 0.3–5 mass %.

(3) Formation of Protection Coating by Spraying Process

When the coating of the B-containing alloy is formed on the surface of Ni-based single crystal alloy substrate as an undercoat, it is necessary that the coating (undercoat) can sufficiently develop the performances aiming at the invention. For this end, it is important to conduct the diffusion movement of B from the undercoat to the surface of the Ni-based single crystal alloy substrate, interact bonding force of sprayed particles in the sprayed undercoat itself, and further the formation reaction of protective oxide film (e.g. $Al_2O_3$, $Cr_2O_3$ or the like) on the coating surface after the undercoat is formed on the substrate surface. A greatest matter for attaining this object is the maintenance of oxide amount included in the coating and the decision of limit content thereof. That is, when the spraying is carried out in air, a great amount of air is incorporated in a heat source or in the vicinity of the heat source to oxidize the spraying material particles, which causes the decrease of interact bonding force of the particles and adhesion force to the substrate alloy. Besides, these oxides suppress the diffusion of B and obstruct the formation of homogeneous protective oxide film on the coating surface.

In the invention, therefore, an amount of oxide included in the undercoat is limited to not more than 1.5 mass % as an oxygen amount. That is, the oxygen amount is controlled to not more than 1.5 mass % by any one of an atmosphere plasma spraying process, a reduced pressure plasma spraying process, an explosion spraying process, a high-speed flame spraying process and the like. Moreover, the kind of the spraying process is not particularly limited.

Concretely, it is preferable to adopt the high-speed flame spraying process, the reduce pressure plasma spraying process and the like.

(4) Formation of Protection Coating by Vapor Deposition Process

Even when PVD process (physical vapor deposition process) is adopted instead of the spraying process if the oxygen amount included in the coating can be controlled to not more than 1.5 mass %, the undercoat satisfying the requirement of the invention can be formed. For example, FIG. 1 shows an apparatus wherein a PVD device (EB-PVD) using an electron beam as a heat source is used and a beam is irradiated from an electron gun 2 to a covering material 1 to evaporate fine steam (arrow) of the material to thereby deposit onto a single crystal alloy 3. This apparatus is accommodated in a vacuum vessel 4, and a vacuum pump 5 and an inlet pipe for an inert gas such as Ar, He or the like are arranged on the vessel, whereby an atmosphere in the vessel can be freely adjusted to a certain extent and hence vapor deposition can be conducted in an inert gas atmosphere without substantially existing air (oxygen), and an oxide is hardly included in the resulting coating. Moreover, a heater 7 for heating the single crystal alloy and a direct current source 8 using the single crystal alloy and the covering material as electrodes are arranged in the apparatus, respectively, so that it is possible to conduct purification treatment with the inert gas and impact of ionized depositing particles onto the surface of the single crystal alloy by applying a voltage as a preliminary treatment for vapor deposition and hence a high adhesion property can be expected.

The undercoat has a beat thickness of 2–150 µm. in case of the coating having a thickness of less than 2 µm, a dense coating is not obtained by the PVD process, while when the thickness exceeds 150 µm, the effect is not considerably developed, so that the thickness is restricted to the above range.

Although the undercoat can be used as a single layer, when it is used in a multi-layer structure as shown in FIG. 2(a)–FIG. 2(d), effective functions are further developed for the protection of the single crystal alloy.

Figure 2A:
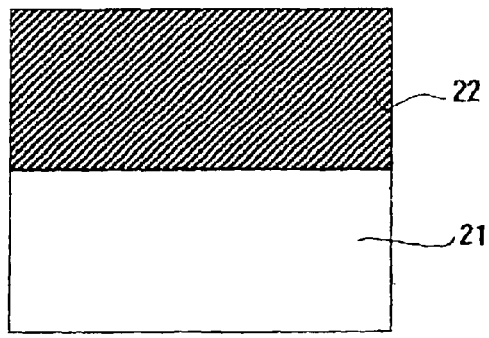
FIG. 2(a)–FIG. 2(d) show diagrammatically section views of layer structures wherein a coating having a resistance to high-temperature by using a B-containing coating according to the invention is formed on a single crystal alloy member or a unidirectional solidified alloy member.

In FIG. 2(a) is shown a case that a B-containing alloy coating (undercoat) 22 is formed on a single crystal alloy substrate 21.

Figure 2B:
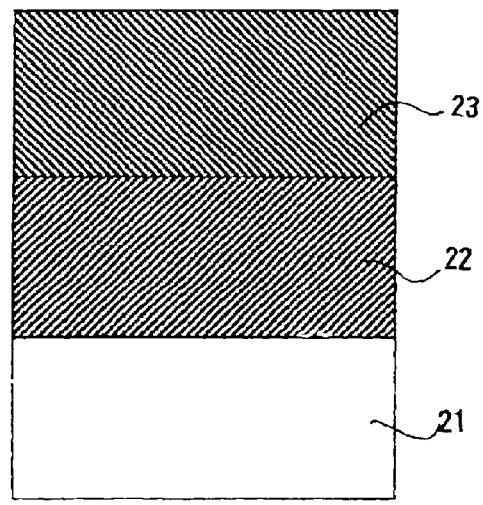

In FIG. 2(b) is shown a two-layer structure that an overcoat 23 of MCrAlX based alloy providing a resistance to high-temperature environment (oxidation) is formed on the undercoat 22.

Figure 2C:
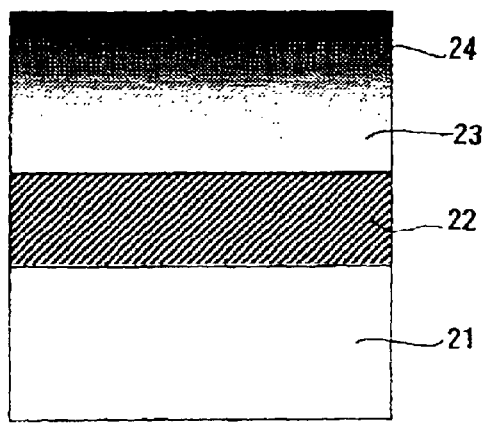

In FIG. 2(c) is shown a case that the upper layer of the two-layer coating (overcoat of MCrAlX alloy) is subjected to a treatment for forming Al diffusion penetration face 24 to more improve the resistance to high-temperature oxidation. (Moreover, the Al diffusion penetration treatment is desirable to be carried out by a known vapor phase process or a powder process (see Japanese Patent Nos. 2960664 and 2960665)).

Figure 2D:
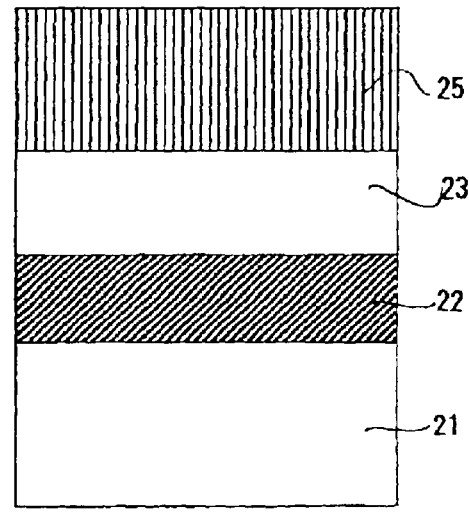

In FIG. 2(d) is shown a three-layer structure that $ZrO_2$ based ceramic coating is formed on the upper layer of the two-layer structure.

In the example of FIG. 2(b), the overcoat 23 formed on the undercoat 22 is a coating of an alloy obtained by adding at least one element selected from Y, Hf, Ta, Cs, Ce, La, Th, W, Si, Pt and Mn to an alloy containing at least two selected from Co, Ni, Cr and Al, which is usually abbreviated as MCrAlX alloy and is preferably used to have the following composition.

As M component are Ni: 0–75 mass %, Co: 0–70 mass %, Fe: 0–30 mass %, Cr: 5–70 mass % and Al: 1–29 mass %, and as X component are Y: 0–5 mass %, Hf: 0–10 mass %, Ta: 1–20 mass %, Si: 0.1–14 mass %, B: 0–0.1 mass %, C: 0–0.25 mass %, Mn: 0–10 mass %, Zr: 0–3 mass %, W: 0–5.5 mass % and Pt: 0–20 mass %.

In the $ZrO_2$ based ceramic coating 25 in FIG. 2(d) is used a $ZrO_2$ based ceramic containing one or more oxides selected from $Y_2O_3$, CeO, CaO, $Yb_2O_3$, $Sc_2O_3$ and MgO. The reason why this coating is formed as a topcoat is to prevent a high-temperature radiant heat mainly discharged from a combustion flame of a fuel.

Moreover, the reason why the oxide other than $ZrO_2$ is included is due to the fact that $ZrO_2$ alone tends to break by changing the crystal form to monoclinic system⇌tetragonal system⇌cubic system in the heating to a higher temperature or the cooling and at the same time causing a large volume change and such a volume change ratio is mitigated by including the above oxide.

EXAMPLE 1

In this example, the presence or absence of the occurrence of a modified layer accompanied with the plastic working of the alloy is examined by using Ni-based single crystal alloy (A-alloy) and Ni-based unidirectional solidified alloy (B-alloy) having a chemical composition as shown in Table 1 together with Ni-based polycrystal alloy (C-alloy) as a comparative example. The heat treating conditions for these test materials are described below the table.

Also, the B-containing alloy material according to the invention is shown in Table 2, and the chemical composition of MCrAlX alloy material is shown in Table 3, and heat treating conditions conducted after the plastic working are shown in Table 4.

TABLE 1

| Alloy | chemical composition/Mass % | | | | | | | | | |
|---|---|---|---|---|---|---|---|---|---|---|
| | Ni | Cr | W | Mo | Co | Al | Ti | Nb | Ta | Hf |
| A (single crystal) | balance | 6.4 | 6.3 | 0.6 | 9.6 | 5.7 | 1.0 | 0.1 | 6.6 | 0.11 |
| B (unidirectional solidified) | balance | 8.0 | 9.4 | — | 9.3 | 5.6 | 0.7 | — | 3.3 | 1.56 |
| C (polycrystal) | balance | 15.8 | 2.5 | 1.8 | 8.1 | 3.4 | 3.6 | 0.9 | 1.9 | — |

Heat treating conditions:

single crystal
(1) 1550K × 2 h→1569K × 3 h→1586K × 3 h→1589K × 3 h
(2) 1594K × 2 h→Ar cooling by gas blowing→
     1413K × 6 h→Ar cooling by gas blowing
(3) 1143K × 20 h→Ar cooling by gas blowing Unidirectional solidified Polycrystal
(1) 1503K × 2 h→Ar cooling by gas blowing
(1) 1393K × 2 h→Ar cooling by gas blowing
(2) 1116K × 2 h→Ar cooling by gas blowing

TABLE 2

| Alloy | chemical composition/Mass % | | | | | | | | | |
|---|---|---|---|---|---|---|---|---|---|---|
| | Cr | Co | Mo | W | Ti | Al | Ta | B | Hf | Ni |
| B-containing alloy | 8.5 | 10.0 | 0.75 | 4.0 | 1.0 | 2.5 | 3.0 | 3.0 | 1.4 | balance |

TABLE 3

| Alloy | chemical composition/Mass % | | | | | | |
|---|---|---|---|---|---|---|---|
| | Cr | Co | Ni | Al | Y | $H_2$ | O |
| MCrAlX alloy | 21.0 | balance | 32.0 | 8.5 | 0.5 | 0.0031 | 0.05 |

TABLE 4

| Conditions | Initial Heat Treatment | Aging heat Treatment |
|---|---|---|
| A | 1353K × 20 h | 1353K × 4 h |
| | | 1143K × 4 h |
| B | 1493K × 1.5 h | 1353K × 4 h |
| | | 1143K × 4 h |
| C | 1523K × 1.5 h | 1353K × 4 h |
| | | 1143K × 4 h |
| D | 1553K × 1.5 h | 1353K × 4 h |
| | | 1143K × 4 h |

Preparation of Test Specimen

The plastic working is applied to the single crystal alloy described in Table 1 (size: diameter 10 mm×length 10 mm) at room temperature under the following conditions.
(1) A steel ball of a Brinell hardness meter is pushed under 980 N.
(2) A surface of the test specimen is cut out at about 1 mm by turning.
(3) A molten alumina grid (1–2 mm) defined in JIS Z0312 is strongly blown onto the test specimen.

After the test specimen after the working is subjected to a heat treatment under conditions A and C in Table 4 and cooled, a section is observed by means of an optical microscope and a scanning type electron microscope.

The observed results are summarized in Table 5. In the test specimen not subjected to the plastic working (test specimen No. 1) is not observed the modified layer. On the contrary, the test specimens subjected to the plastic working form the modified layer irrespectively of the difference of the heat treating conditions and the kind of the plastic working process, and particularly the modified layer reaching to max 50 μm is formed in the test specimen subjected to the turning. The modified layer is constructed with coarse γ'-precipitation phase and γ-phase, and also a phenomenon looking the decomposition of γ'-phase as a high-temperature strength factor is observed at the boundary between the modified layer and an unchanged portion and the formation of the factor bringing the deterioration of the high-temperature strength is confirmed.

TABLE 5

| No. | Substrate alloy | Working process of substrate | Heat treating of condition | Presence or absence of modified layer (recrystal) |
|---|---|---|---|---|
| 1 | Single crystal alloy | not worked | C | absence |
| 2 | | pressed by steel bowl | A | formation of modified layer around pressed portion |
| 3 | | | C | same as above |
| 4 | | turning | A | *formation of modified layer at a thickness of 30–50 um |
| 5 | | | C | same as above |
| 6 | | blast treatment | A | formation of discontinuous modified layer |
| 7 | | | C | same as above |

(Remarks)
*shows a change of modified layer in a thickness of 30–50 um in accordance with working conditions.

EXAMPLE 2

In this example, influence upon plastic working, heat treatment, sprayed coating and the like is examined by a high-temperature fatigue test with respect to the single crystal alloy and the unidirectional solidified alloy.

(1) Points of Fatigue Test and Preparation of Test Specimen

In the fatigue test, an electric hydraulic servo-valve type fatigue testing apparatus having performances of maximum load: 5 ton, stoke: 50 mm (stretching and shrinking) and frequency: 0.01–20 Hz is used, and the heating of the test specimen is carried out by using a high frequency induction heating system at 950° C. in air under conditions of stress ratio R=−1, sine stress wave and frequency: 10 Hz.

On the other hand, two kinds of single crystal alloy and unidirectional solidified alloy are used as a material for the fatigue test, and the following process is adopted as an application of plastic strain.

(a) Application of Compression Strain Through Die Forging

Figure 3A:
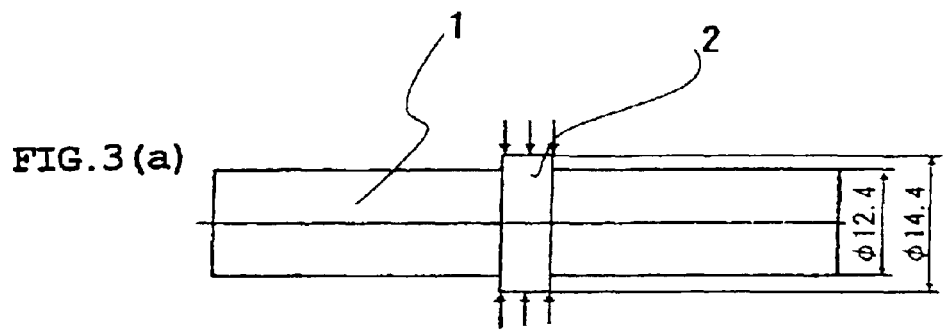
FIG. 3(a)–FIG. 3(c) are schematic views of the way of cutting out a high-temperature fatigue test piece from the round rod.
Figure 3B:
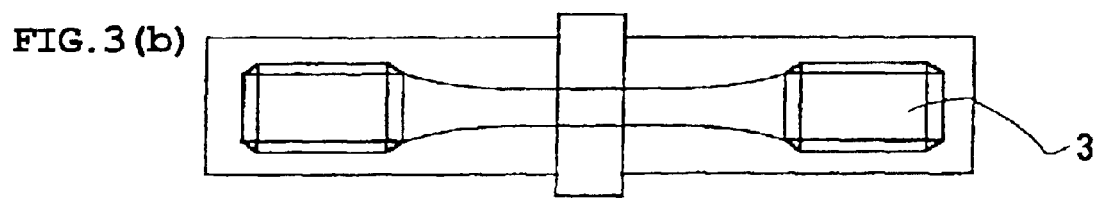
Figure 3C:
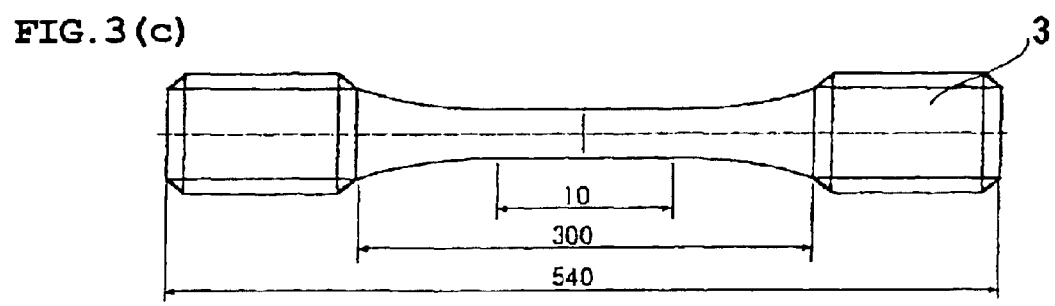

After a round rod having a convex portion as shown in FIG. 3(a)–FIG. 3(c) is cut out, compression strain corresponding to about 8.3% as converted in a radial direction is applied to the convex portion at room temperature through die forging. Then, a heat treatment shown in Table 4 is conducted and thereafter a smooth rod piece for the fatigue test having a diameter in parallel part of 4 mm and a length in parallel part of 10 mm is formed from a central portion of the test specimen as shown in FIG. 3(c).

(b) Application of Strain Through Turning

The test specimen is cut at a radius of about 1 mm through a lathe and subjected to a heat treatment of 1353 K×100 h to obtain a fatigue test piece. The turning conditions are cutting depth of 0.2–0.25 mm and delivery quantity of 0.051–0.2 mm.

(2) Formation of Sprayed Coating

The B-containing alloy shown in Table 2 or the MCrAlX alloy shown in Table 3 is applied onto the whole face of the parallel portion of the fatigue test piece at a thickness of 150 μm by a reduced pressure plasma spraying process, and the B-containing alloy as an undercoat and the MCrAlX alloy as an overcoat are applied thereonto.

(3) Results of the Fatigue Test

The results with respect to the single crystal alloy are summarized in Table 6. These results are compared as an average strength ratio to other test piece when a strength of a virgin material of the single crystal alloy (test piece not subjected to plastic working No. 1) is made 100. As seen from these results, in case of the alloys not subjected to the plastic working, even if the B-containing alloy or MCrAlX alloy coating is laminated, the change of fatigue strength is less and the oxidation reaction in atmosphere environment is somewhat suppressed.

On the contrary, when the test piece is previously subjected to the die forging (No. 4) or the turning (No. 8), the recrystallization phenomenon is caused by the heat treatment to extremely lower the fatigue strength, which shows a fatal deterioration of the strength as the single crystal alloy. However, when the B-containing alloy coating is previously formed, the deterioration of the fatigue strength is very less as seen from the test pieces No. 5, 9 and 11, and it is possible to prevent the deterioration of the strength accompanied with the recrystallization. This tendency is observed even in the application of the MCrAlX alloy (test pieces No. 6 and 10), but the effect of mitigating the deterioration ratio of the strength is less as compared with that of the B-containing alloy. The MCrAlX alloy coating is considered to be dependent upon the effect of the resistance to high-temperature environment.

Moreover, as seen from the test pieces No. 7 and 12, when the B-containing alloy is formed as an undercoat and the MCrAlX alloy is formed as an overcoat, the fatigue strength is substantially returned, so that it is necessary to directly contact the application the B-containing alloy with the single crystal alloy.

TABLE 6

| | Alloy of test piece | Working process of substrate | Heat treating condition | kind of coating material | | Fatigue strength ratio | Remarks |
| | | | | B-containing alloy | MCrALX-containing alloy | | |
|---|---|---|---|---|---|---|---|
| 1 | Single Crystal alloy | no plastic working | A | absence | absence | 100 | B |
| 2 | | | A | presence | absence | 102 | A |
| 3 | | | A | absence | presence | 101 | B |
| 4 | | die forging | C | absence | absence | 25 | B |
| 5 | | | C | presence | absence | 99 | A |
| 6 | | | C | absence | presence | 82 | B |
| 7 | | | D | presence | presence | 99 | A |
| 8 | | cutting through lathe | A | absence | absence | 35 | B |
| 9 | | | A | presence | absence | 97 | A |
| 10 | | | A | absence | presence | 77 | B |
| 11 | | | B | presence | absence | 98 | A |
| 12 | | | B | presence | presence | 101 | A |

Note
(1) Composition of single crystal alloy is shown in Table 1.
(2) Heat treating conditions are shown in Table 4.
(3) Chemical composition of the B-containing alloy is shown in Table 2.
(4) Chemical composition of the MCrAlX alloy is shown in Table 3.
(5) Thickness of sprayed coating is 150 μm.
(6) A in remarks is an invention example, B is a comparative example.
(7) Fatigue strength is represented by an average strength ratio on the basis that the virgin material of single crystal alloy (test piece No. 1) is 100.

On the other hand, results measured on the unidirectional solidified alloy are shown in Table 7. In the unidirectional solidified alloy, the influence of plastic working is not strongly received as compared with the single crystal alloy, but the fatigue strength is deteriorated. The sprayed coating of the B-containing alloy is observed to have an efficiency of mitigating the deterioration of the strength based on the recrystallization of the unidirectional solidified alloy (test pieces No. 5, 7, 9, 11, 12).

TABLE 7

| | Alloy of test piece | Working process of substrate | Heat treating condition | kind of coating material B-containing alloy | kind of coating material MCrALX-containing alloy | Fatigue strength ratio | Remarks |
|---|---|---|---|---|---|---|---|
| 1 | unidirectional solidified | no plastic working | A | absence | absence | 100 | B |
| 2 | | | A | presence | absence | 101 | A |
| 3 | | | A | absence | presence | 101 | B |
| 4 | | die forging | C | absence | absence | 51 | B |
| 5 | | | C | presence | absence | 95 | A |
| 6 | | | C | absence | presence | 78 | B |
| 7 | | | D | presence | presence | 98 | A |
| 8 | | cutting through lathe | A | absence | absence | 60 | B |
| 9 | | | A | presence | absence | 96 | A |
| 10 | | | A | absence | presence | 80 | B |
| 11 | | | B | presence | absence | 96 | A |
| 12 | | | B | presence | presence | 99 | A |

Note
(1) Composition of single crystal alloy is shown in Table 1.
(2) Heat treating conditions are shown in Table 4.
(3) Chemical composition of the B-containing alloy is shown in Table 2.
(4) Chemical composition of the MCrAlX alloy is shown in Table 3.
(5) Thickness of sprayed coating is 150 μm.
(6) A in remarks is an invention example, B is a comparative example.
(7) Fatigue strength is represented by an average strength ratio on the basis that the virgin material of single crystal alloy (test piece No. 1) is 100.

EXAMPLE 3

In this example, a fatigue test piece of a single crystal alloy is subjected to a cutting through a lathe as a plastic working adopted in Example 2 and a heat treatment under heat treating conditions A and a coating as mentioned below is formed by a reduced pressure plasma spraying process, a high-speed plasma spraying process or an electron beam vapor deposition process as a coating forming process.

Coating Material
(1) B-containing alloy shown in Table 2
(2) product corresponding to SFNi$_2$ defined in JIS H8303 and having a B content of 2.1 mass %
(3) mixed composite powder of 50 mass % of B-containing alloy shown in Table 2/50 mass % of MCrAlX alloy shown in Table 3
(4) mixed composite powder of 50 mass % of SFNi$_2$ alloy/50 mass % of MCrAlX alloy The results of fatigue test according to 1223K with respect to the above test pieces are summarized in Table 8. In these results are also shown the fatigue strength results of the test piece not subjected to the plastic working and the test piece subjected to the plastic working but not forming the coating in the comparative examples obtained in Table 2 (test pieces No. 1 and No. 8 in Table 7) as a comparative example. As seen from these results, when the B-containing alloy is directly formed on the surface of the single crystal alloy as a coating, the deterioration ratio of the fatigue strength can be considerably reduced even in not only the two spraying processes but also the vapor deposition process (test pieces Nos. 3–10). And also, the effect is observed even in the composite mixture of the B-containing alloy and the MCrAlX alloy, so that the addition of B to the MCrAlX alloy is considered to be effective.

TABLE 8

| | Alloy of test piece | Working process of substrate | Heat treating condition | Formation process of coating | Coating material | Fatigue strength ratio | Remarks |
|---|---|---|---|---|---|---|---|
| 1 | Single crystal alloy | no plastic working | A | no treatment | none | 100 | B |
| 2 | | cutting through lathe | | | none | 35 | B |
| 3 | | | | Reduced pressure plasma spraying process | B-containing alloy | 98 | A |
| 4 | | | | | SFNi$_2$-containing alloy | 96 | A |
| 5 | | | | | 50B-containing alloy/50MCr Alx | 92 | A |
| 6 | | | | | 50B-containing alloy/50MCr Alx | 90 | A |

TABLE 8-continued

| Alloy of test piece | Working process of substrate | Heat treating condition | Formation process of coating | Coating material | Fatigue strength ratio | Remarks |
|---|---|---|---|---|---|---|
| 7 | | | High-speed flame spraying process | B-containing alloy | 96 | A |
| 8 | | | | SFNi$_2$-containing alloy | 97 | A |
| 9 | | | Vapor deposition process | B-containing alloy | 98 | A |
| 10 | | | | SFNi$_2$-containing alloy | 97 | B |

Note
(1) Composition of single crystal alloy is shown in Table 1.
(2) Heat treating conditions are shown in Table 4.
(3) Chemical composition of the B-containing alloy is shown in Table 2.
(4) Chemical composition of the MCrAlX alloy is shown in Table 3.
(5) Thickness of sprayed coating is 150 μm.
(6) A in remarks is an invention example, B is a comparative example.
(7) Fatigue strength is represented by an average strength ratio on the basis that the virgin material of single crystal alloy (test piece No. 1) is 100.

EXAMPLE 4

In this example, the resistance to thermal impact is examined with respect to the coatings according to the invention formed on the surfaces of the single crystal alloy and the unidirectional solidified alloy.

(1) Shape and Size of Substrate to be Tested and Test Piece

As a substrate to be tested are used the single crystal alloy and the unidirectional solidified alloy shown in Table 1, which are finished to rod test pieces each having a diameter of 15 mm and a length of 50 mm.

(2) Presence or Absence of Plastic Working in Test Piece

The turning conditions shown in Table 1 are applied to the rod test piece.

(3) Kind of Coating to be Tested and Coating Process

The alloy shown in Table 2 is used as the B-containing alloy coating according to the invention, the alloy shown in Table 3 is used as the MCrAlX alloy, and 8%Y$_2$O$_3$.ZrO$_2$ is used as ZrO$_2$ based ceramic, and the reduced pressure plasma spraying process, high-speed flame spraying process and EB-PVD process are carried out as the coating process.
(a) only B-containing alloy
(b) two layer structure of B-containing alloy/MCrAlX alloy
(c) three-layer structure of B-containing alloy/MCrAlX alloy/Y$_2$O$_3$.ZrO$_2$ (4) Conditions of Thermal Impact Test The test piece is heated in an electric furnace held at 950° C. for 15 minutes and cooled by charging into water of 25° C. as one cycle, and this procedure is repeated 10 cycles to examine a change of appearance of the coating and presence or absence of peeling.

(5) Test Results

The test results are summarized in Tables 9 and 10. In Table 9 are shown results with respect to the test pieces of the single crystal alloy substrate, in which the coatings belonging to the conventional technique, for example, the cases that the MCrAlX alloy coating is directly formed on the substrate surface as in the test pieces Nos. 4, 5, 9, 10, 14 and 15 are excellent in the resistance to thermal impact. However, when the B-containing alloy coating is formed as an undercoat adaptable to the invention, both the resistance to thermal impact and the resistance to high-temperature environment are excellent, from which such a coating is understood to be a preferable coating as compared with the conventional coating. In case of only the B-containing alloy coating (test pieces Nos. 1, 6, 11), greenish oxide film resulted from an oxide of Cr, Ni is produced and a degree of a color change in the appearance is large. Even in this case, however, the peeling of the coating is not observed.

In Table 10 are shown results with respect to the test pieces of the unidirectional solidified alloy substrate, in which the coating performance on the unidirectional solidified alloy substrate are not changed and the peeling of the coating is not observed.

Moreover, the formation of the modified layer is observed in all of the test pieces as the section of the substrate after the test is examined by means of an optical microscope.

TABLE 9

| | | Construction and thickness of coating (μm) | | | | |
|---|---|---|---|---|---|---|
| No. | Coating process | B-containing alloy | MCrAlX | Y$_2$O$_3$.ZrO$_2$ | Thermal impact test results | Remarks |
| 1 | Reduced pressure | 30 | — | — | change into green but no pealing | A |

TABLE 9-continued

| No. | Coating process | B-containing alloy | MCrAlX | Y₂O₃·ZrO₂ | Thermal impact test results | Remarks |
|---|---|---|---|---|---|---|
| 2 | plasma spraying process | 30 | 100 | — | less in color change and no pealing | A |
| 3 | | 30 | 100 | 300* | less in color change and no pealing | A |
| 4 | | — | 100 | — | same as above | B |
| 5 | | — | 100 | 300* | same as above | B |
| 6 | High-speed flame spraying process | 30 | — | — | change into green but no pealing | A |
| 7 | | 30 | 100 | — | less in color change and no pealing | A |
| 8 | | 30 | 100 | 300* | same as above | A |
| 9 | | — | 100 | — | same as above | B |
| 10 | | — | 100 | 300* | same as above | B |
| 11 | Electron beam vapor deposition process | 10 | — | — | change into green but no pealing | A |
| 12 | | 10 | 80 | — | less in color change and no pealing | A |
| 13 | | 10 | 80 | 250* | same as above | B |
| 14 | | — | 80 | — | same as above | B |
| 15 | | — | 80 | 150* | same as above | B |

(Note)
(1) A substrate of test piece is a single crystal alloy shown in Table 1
(2) A working for test piece is a turning
(3) Heat treating conditions after the formation of the coating are B shown in Table 4
(4) A in remarks is an invention example, B is a comparative example
(5) The formation of Y₂O₃·ZrO₂ coating is carried out by an atmosphere plasma spraying process (*)

TABLE 10

| No. | Coating process | B-containing alloy | MCrAlX | Y₂O₃·ZrO₂ | Thermal impact test results | Remarks |
|---|---|---|---|---|---|---|
| 1 | Reduced pressure plasma spraying process | 30 | — | — | change into green but no pealing | A |
| 2 | | 30 | 100 | — | less in color change and no pealing | A |
| 3 | | 30 | 100 | 300* | less in color change and no pealing | A |
| 4 | | — | 100 | — | same as above | B |
| 5 | | — | 100 | 300* | same as above | B |
| 6 | High-speed flame spraying process | 30 | — | — | change into green but no pealing | A |
| 7 | | 30 | 100 | — | less in color change and no pealing | A |
| 8 | | 30 | 100 | 300* | same as above | A |
| 9 | | — | 100 | — | same as above | B |
| 10 | | — | 100 | 300* | same as above | B |
| 11 | Electron beam vapor deposition process | 10 | — | — | change into green but no pealing | A |
| 12 | | 10 | 80 | — | less in color change and no pealing | A |

TABLE 10-continued

| | | Construction and thickness of coating (μm) | | | | |
|---|---|---|---|---|---|---|
| No. | Coating process | B-containing alloy | MCrAlX | Y₂O₃·ZrO₂ | Thermal impact test results | Remarks |
| 13 | | 10 | 80 | 250* | same as above | B |
| 14 | | — | 80 | | same as above | B |
| 15 | | — | 80 | 150* | same as above | B |

(Note)
(1) A substrate of test piece is a unidirectional solidified alloy shown in Table 1
(2) A working for test piece is a turning
(3) Heat treating conditions after the formation of the coating are B shown in Table 4
(4) A in remarks is an invention example, B is a comparative example
(5) The formation of Y₂O₃·ZrO₂ coating is carried out by an atmosphere plasma spraying process (*)

As mentioned above, the conventional single crystal alloy and unidirectional solidified alloy substrates previously subjected to strain or plastic working have a fatal defect that when they are heated to a higher temperature, the modified layer accompanied with the recrystallization is produced on their surfaces and hence they are easily broken even under a slight loading stress and the excellent high-temperature strength inherent to such an alloy can not be developed.

On the contrary, according to the invention, when the undercoat of B-containing alloy is directly formed on the surface of the above alloy substrate by spraying process or vapor deposition process, B preferentially diffuses into the alloy substrate in a high-temperature environment to strengthen the interact bonding force at the recrystallization grain boundary, and as a result the deterioration of the high-temperature strength can be effectively reduced to develop the strength of the substrate itself.

According to another embodiment of the invention, physical-chemical action to combustion gas component in the high-temperature environment can be improved by the lamination of the B-containing alloy coating and the MCrAlX alloy coating, or the composite coating of the mixture of the B-containing alloy with the MCrAlX alloy, or further the lamination with the ZrO₂ based ceramic coating.

The above effects can completely remove the aforementioned risk factor when the coating according to the invention is applied to a high-temperature strength member having frequently a chance accompanied with the application of strain or plastic working at not only the production and assembling steps but also during the operation or the coating retreating step after the operation such as gas turbine blade member or the like of the single crystal alloy or unidirectional solidified alloy and are effective.

Therefore, the invention largely contribute to not only the improvement of the quality and productivity of the gas turbine blade member of this kind of the alloy but also the stable operation of the gas turbine over a long time and the reduction of power unit cost.

What is claimed is:

1. A high-temperature strength member comprising a plastic worked substrate of a Ni-based single crystal alloy or a Ni-based unidirectional solidified alloy, said substrate comprising a modified layer, and a sprayed or vapor deposited coating of a B-containing alloy comprising 0.1–5.0 mass % of B, less than 1.5 mass % of oxygen as metal oxides and the remainder being two or more elements selected from Cr, Ni, Co, Mo, Al, Ta, W, Re, Zr, Hf, Y, Si, Pt, Ti and Fe formed on a surface of said substrate.

2. A high-temperature strength member according to claim 1, wherein the B-containing alloy formed as a coating on the surface of the substrate further contains 0.01–1.5 mass % of C.

3. A high-temperature strength member according to claim 2, wherein the member comprises a turbine blade.

4. A high-temperature strength member according to claim 1, wherein the B-containing alloy further contains 0.01–1.5 mass % of C and an alloy comprising at least two elements selected from Co, Ni, Cr and Al and added with at least one element selected from Y, Hf, Ta, Cs, Ce, La, Th, W, Si, Pt and Mn.

5. A high-temperature strength member according to claim 4, wherein the member comprises a turbine blade.

6. A high-temperature strength member according to claim 1, wherein a B-diffused penetration layer is formed on the surface of the substrate after the formation of the undercoat of the B-containing alloy comprising 0.1–5.0 mass % of B.

7. A high-temperature strength member according to claim 6, wherein the member comprises a turbine blade.

8. A high-temperature strength member according to claim 1, wherein the member comprises a turbine blade.

9. A high-temperature strength member comprising a plastic worked substrate of a Ni-based single crystal alloy or a Ni-based unidirectional solidified alloy, said substrate comprising a modified layer, a sprayed or vapor deposited coating of a B-containing alloy comprising 0.1–5.0 mass % of B, less than 1.5 mass % of oxygen as metal oxides and the remainder being two or more elements selected from Cr, Ni, Co, Mo, Al, Ta, W, Re, Zr, Hf, Y, Si, Pt, Ti and Fe formed on a surface of said substrate as an undercoat, and a coating of an alloy comprising at least two elements selected from Co, Ni, Cr and Al and further added with at least one element selected from Y, Hf, Ta, Cs, Ce, La, Th, W, Si, Pt and Mn as an overcoat formed on the undercoat.

10. A high-temperature strength member according to claim 1, wherein the B-containing alloy formed as a coating on the surface of the substrate further contains 0.01–1.5 mass % of C.

11. A high-temperature strength member according to claim 10, wherein the member comprises a turbine blade.

12. A high-temperature strength member according to claim 9, wherein the member comprises a turbine blade.

13. A high-temperature strength member comprising a plastic worked substrate of a Ni-based single crystal alloy or a Ni-based unidirectional solidified alloy, said substrate comprising a modified layer, a sprayed or vapor deposited coating of a B-containing alloy comprising 0.1–5.0 mass % of B, less than 1.5 mass % of oxygen as metal oxides and the remainder being two or more elements selected from Cr, Ni, Co, Mo, Al, Ta, W, Re, Zr, Hf, Y, Si, Pt, Ti and Fe formed on a surface of said substrate as an undercoat, a coating of an alloy comprising at least two elements selected from Co, Ni, Cr and Al and further added with at least one element selected from Y, Hf, Ta, Cs, Ce, La, Th, W, Si, Pt and Mn as an overcoat formed on the undercoat and an Al diffused layer formed on a surface of the overcoat.

14. A high-temperature strength member according to claim 13, wherein the B-containing alloy formed as a coating on the surface of the substrate further contains 0.01–1.5 mass % of C.

15. A high-temperature strength member according to claim 14, wherein the member comprises a turbine blade.

16. A high-temperature strength member according to claim 13, wherein the member comprises a turbine blade.

17. A high-temperature strength member comprising a plastic worked substrate of a Ni-based single crystal alloy or a Ni-based unidirectional solidified alloy, said substrate comprising a modified layer, a sprayed vapor deposited coating of a B-containing alloy comprising 0.1–5.0 mass % of B, less than 1.5 mass % of oxygen as metal oxides and the remainder being two or more elements selected from Cr, Ni, Co, Mo, Al, Ta, W, Re, Zr, Hf, Y, Si, Pt, Ti and Fe formed on a surface of said substrate as an undercoat, a coating of an alloy comprising at least two elements selected from Co, Hi, Cr and Al and further added with at least one element selected from Y, Hf, Ta, Cs, Ce, La, Th, W, Si, Pt and Mn as an overcoat formed on a surface of the undercoat, and a coating of a $ZrO_2$ based ceramic including at least one oxide selected from $Y_2O_3$, CaO, MgO, $Yb_2O_3$, $Sc_2O_3$ and $CeO_2$ as a topcoat formed on the overcoat.

18. A high-temperature strength member according to claim 17, wherein the B-containing alloy formed as a coating on the surface of the substrate further contains 0.01–1.5 mass % of C.

19. A high-temperature strength member according to claim 18, wherein the member comprises a turbine blade.

20. A high-temperature strength member according to claim 17, wherein the member comprises a turbine blade.

* * * * *

UNITED STATES PATENT AND TRADEMARK OFFICE
CERTIFICATE OF CORRECTION

PATENT NO. : 6,818,321 B2
DATED : November 16, 2004
INVENTOR(S) : M. Okazaki et al.

It is certified that error appears in the above-identified patent and that said Letters Patent is hereby corrected as shown below:

Title page,
Item [56], References Cited, FOREIGN PATENT DOCUMENTS,
"083211633" should be -- 08311633 --.

Column 20,
Line 52, "claim 1" should be -- claim 9 --.

Column 21,
Line 4, after "undercoat" insert -- , --.

Signed and Sealed this

Thirtieth Day of May, 2006

JON W. DUDAS
*Director of the United States Patent and Trademark Office*